United States Patent
Chakravarty

(12) 
(10) Patent No.: US 8,656,233 B2
(45) Date of Patent: Feb. 18, 2014

(54) SCAN CELL DESIGNS WITH SERIAL AND PARALLEL LOADING OF TEST DATA

(75) Inventor: Sreejit Chakravarty, Mountain View, CA (US)

(73) Assignee: LSI Corporation, Milpitas, CA (US)

( * ) Notice: Subject to any disclaimer, the term of this patent is extended or adjusted under 35 U.S.C. 154(b) by 363 days.

(21) Appl. No.: 12/982,642

(22) Filed: Dec. 30, 2010

(65) Prior Publication Data

US 2012/0173939 A1 Jul. 5, 2012

(51) Int. Cl.
*G01R 31/28* (2006.01)
(52) U.S. Cl.
USPC .......................................... 714/726
(58) Field of Classification Search
USPC ................................. 714/726, 727
See application file for complete search history.

(56) References Cited

U.S. PATENT DOCUMENTS

| | | | |
|---|---|---|---|
| 7,487,419 B2 | 2/2009 | Mukherjee et al. | |
| 2004/0123198 A1* | 6/2004 | Gschwind | 714/726 |
| 2004/0190331 A1* | 9/2004 | Ross et al. | 365/154 |
| 2008/0104466 A1* | 5/2008 | Menon et al. | 714/727 |
| 2009/0217116 A1* | 8/2009 | Motika et al. | 714/729 |
| 2012/0124435 A1* | 5/2012 | Eaton et al. | 714/726 |

* cited by examiner

*Primary Examiner* — Michael Maskulinski
*Assistant Examiner* — Neil Miles

(57) ABSTRACT

A scan cell is configured to receive first, second and third data bits at respective first, second and third data inputs. A control input is configured to receive a control signal. Latching logic is configured to latch data received at the first and second latch inputs to a scan cell output. The first latch input is configured to receive the first data bit. Selection logic is configured to select between the second and third data bits depending on a state of the control signal, and to provide the selected bit to the second latch input.

13 Claims, 6 Drawing Sheets

SCAN CELL DESIGNS WITH SERIAL AND PARALLEL LOADING OF TEST DATA

CROSS-REFERENCE TO RELATED APPLICATIONS

This application is related to U.S. patent application Ser. No. 12/982,634 filed Dec. 30, 2010, and entitled SCAN CELL DESIGNS WITH SERIAL AND PARALLEL LOADING OF TEST DATA which is incorporated herein by reference.

TECHNICAL FIELD

This application is directed, in general, to an electronic device, and, more specifically, to testing thereof.

BACKGROUND

A complex integrated circuit (IC) device often includes test circuitry. Such circuitry may be used to test the device at the end of the manufacturing line, or may be used after the device is shipped and installed by a system integrator to ensure continued proper operation of the device.

A scan chain is sometimes used in the test circuitry. The scan chain typically includes a number of scan cells arranged such that a scan cell at a later stage of the chain receives the output of a scan cell at an earlier stage of the chain. A multiplexer located between the scan cells receives the prior cell's output and a functional bit from device logic that may be tested using the scan chain. When a scan is enabled, the multiplexer selects the output of the previous scan cell for input to the later scan cell. When the scan is disabled, the multiplexer selects the functional bit. Thus, test data may be serially loaded into the scan chain, and input to the logic under test. Internal values produced by the logic under test may then be serially shifted out of the scan chain for evaluation.

SUMMARY

One aspect provides a scan cell. The scan cell is configured to receive first, second and third data bits at respective first, second and third data inputs. A control input is configured to receive a control signal. Latching logic is configured to latch data received by first and second latch inputs to a scan cell output. The first latch input is configured to receive the first data bit. Selection logic is configured to select between the second and third data bits depending on a state of the control signal, and to provide the selected bit to the second latch input.

Another embodiment provides an integrated circuit (IC). The IC includes scan cell located over a semiconductor substrate. The scan cell is configured to receive first, second and third data bits at respective first, second and third data inputs. A control input is configured to receive a control signal. Latching logic is configured to latch data received at first and second latch inputs to a scan cell output. The first latch input is configured to receive the first data bit. Selection logic is configured to select between the second and third data bits depending on a state of the control signal, and to provide the selected bit to the second latch input.

Another embodiment provides a method of forming an IC. The method includes forming a scan cell over a semiconductor substrate. The scan cell is configured to receive first, second and third data bits at respective first, second and third data inputs. A control input is configured to receive a control signal. Latching logic is configured to latch data received at first and second latch inputs to a scan cell output. The first latch input is configured to receive the first data bit. Selection logic is configured to select between the second and third data bits depending on a state of the control signal, and to provide the selected bit to the second latch input.

Yet another embodiment is a library of standard logic elements. The library includes a standard logic element corresponding to a scan cell. The scan cell is configured to receive first, second and third data bits at respective first, second and third data inputs. A control input is configured to receive a control signal. Latching logic is configured to latch data received at first and second latch inputs to a scan cell output. The first latch input is configured to receive the first data bit. Selection logic is configured to select between the second and third data bits depending on a state of the control signal, and to provide the selected bit to the second latch input.

BRIEF DESCRIPTION

Reference is now made to the following descriptions taken in conjunction with the accompanying drawings, in which.

DETAILED DESCRIPTION

Figure 1A:
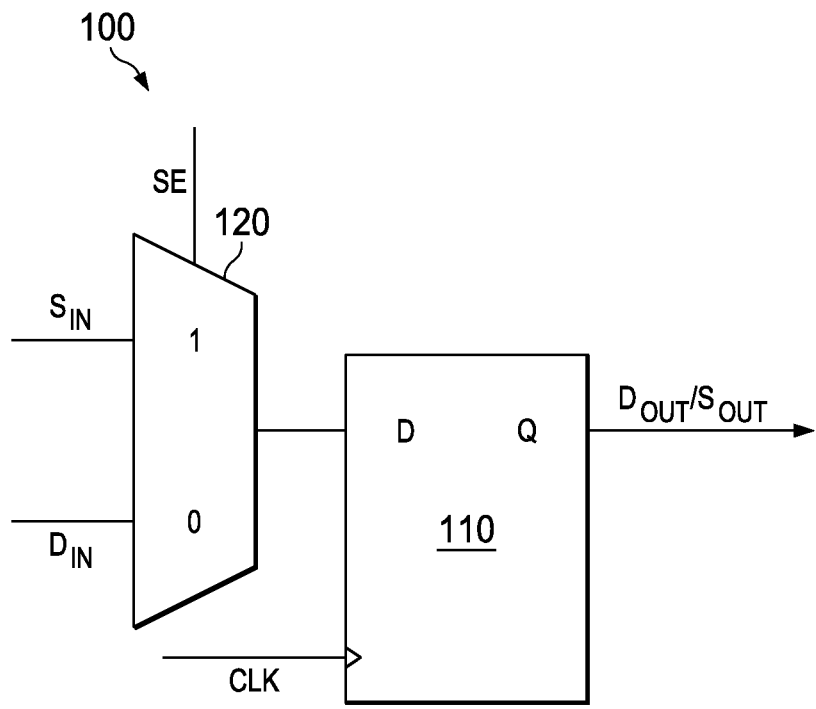
FIGS. 1A, 1B, 2A and 2B illustrate prior art scan cells.

Herein a digital signal may be equivalently described having a value of TRUE or "1". A digital signal may also be equivalently described having a value of FALSE or "0". Herein when an input to a logical element is described as being "configured" to receive a particular input, the input may include any number of gates, transistors or interconnects suitably configured to provide the desired input functionality. Herein a data bit is a bit of a serial data stream or a parallel data word that conveys information, as opposed to a clock or a control bit that exerts control over the function of one or more logic elements such as a multiplexer. Herein a multiplexer delay is a delay subjected on a data bit presented at a data input of a multiplexer. A multiplexer is any combination of gates, transistors, interconnects, etc configured to select between first and second data inputs under the control of a selector control signal presented at a selector input. Herein a data input is an input configured to receive a data bit, as opposed to a selector signal or a clock signal. Herein, a signal may be referred to as "asserted" or "unasserted". An asserted signal is one that has a logical level selected to result in a stated effect. The signal may be referred to as unasserted when the signal has a logical level that does not result in the stated effect. An asserted signal may be a logical "1" or a logical "0" depending on the specific configuration of logical elements.

Scan chains are conventionally used at the end of a manufacturing line to test various portions of an IC device. Test data provided by an end-of-line tester may be serially shifted into the scan chain. Internal functional data that results from the test data may be loaded into the scan chain. The internal data may then be serially shifted out of the scan chain and evaluated.

In some cases, however, it may also be desirable to test a functional block of the device after the device has shipped to a customer. A functional block may be or include, for example, a memory or functional, e.g. combinatorial, logic. Conventionally such testing may be done using built-in self-test (BIST) circuitry that includes a BIST engine designed to provide various test vectors to the functional block to ensure accurate operation. The test vectors are typically provided in the form of parallel data, such as a word of data to be loaded into a memory. In such cases it may be desirable or necessary to integrate the BIST circuitry with the scan chain. It may also be desirable or necessary to retain the ability to provide test data to the functional block in serial fashion via a scan chain to provide end-of-line test capability. However, conventional scan chains are not equipped to accommodate both serial and parallel data without increasing the latency of a critical data path.

This disclosure includes embodiments that provide the novel ability of a scan chain to support both serial and parallel loading of test data without increasing critical data latency. Thus, a single scan chain may support both end-of-line testing and BIST testing without reducing performance of the IC during normal operation. Self-test of the functional block after installation of the IC is therefore possible with little or no performance penalty and without the need for redundant test circuitry.

Turning to FIG. 1A, a multiplexing scan cell 100 representative of some conventional designs is illustrated. The scan cell 100 includes a D-type flip-flop 110 and a multiplexer 120. The multiplexer 120 receives an $S_{IN}$ (serial_in) bit and a $D_{IN}$ (data_in) bit at its data inputs. Typically the $S_{IN}$ bit is received from a previous scan cell in a scan chain in which the scan cell 100 operates. When an SE (scan enable) signal is asserted (e.g. TRUE) the multiplexer 120 selects the $S_{IN}$ bit for input to the flip-flop 110. When SE is unasserted (e.g. FALSE), the multiplexer 120 selects the $D_{IN}$ bit for input to the flip-flop 110. A CLK signal latches the output of the multiplexer 120 to the Q output of the flip-flop, with the $S_{IN}$ bit being output as $S_{OUT}$, and the $D_{IN}$ bit being output as $D_{OUT}$.

Figure 1B:
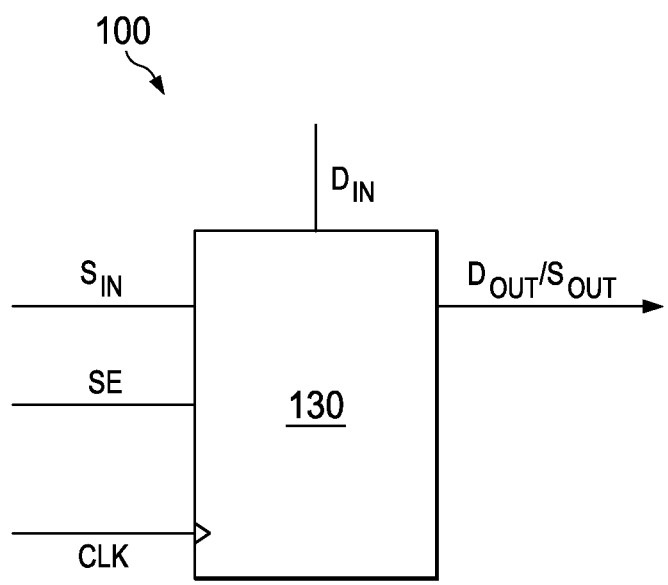

FIG. 1B illustrates a functional abstraction 130 of the scan cell 100. The functional abstraction 130 may be implemented as an element of a library of standard logic elements. In this representation, the scan cell 100 appears as a single functional block with two data inputs for $S_{IN}$ and $D_{IN}$, a selector input for SE, and a clock input. A single output provides the selected $S_{OUT}$ or $D_{OUT}$ bit.

Figure 2A:
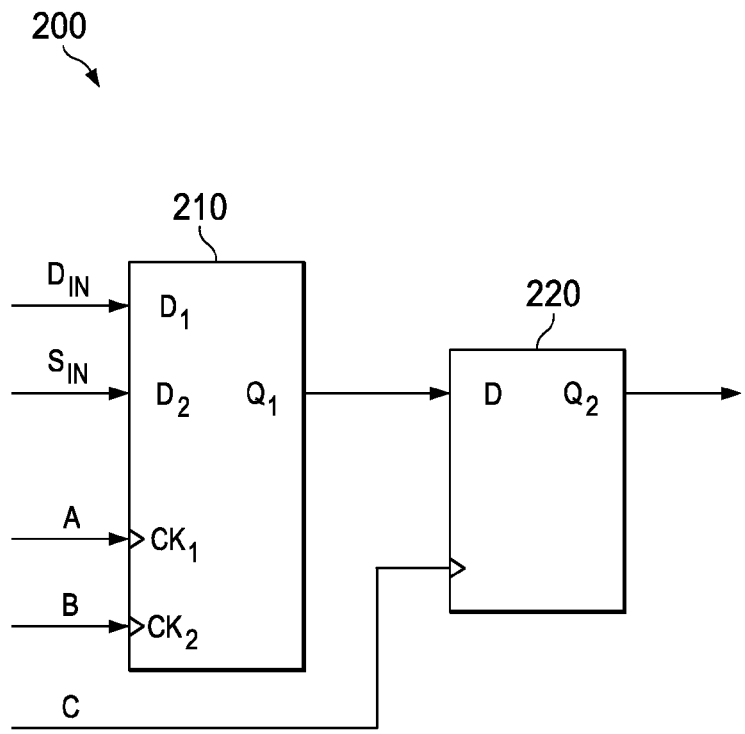

FIG. 2A illustrates another conventional scan cell 200 design, referred herein as a two-port latch design. A two-port latch 210 receives the $D_{IN}$ bit at a first D input, $D_1$. The $D_{IN}$ bit is clocked through to a $Q_1$ output upon the active edge of an "A" clock at a $CK_1$ input. The latch 210 receives the $S_{IN}$ bit at a second D input $D_2$. The $S_{IN}$ bit is clocked through to the $Q_1$ output upon the active edge of a "B" clock at a $CK_2$ input. The $Q_1$ output is clocked through to a $Q_2$ output of a D flip-flop 220 upon the active edge of a "C" clock.

Figure 2B:
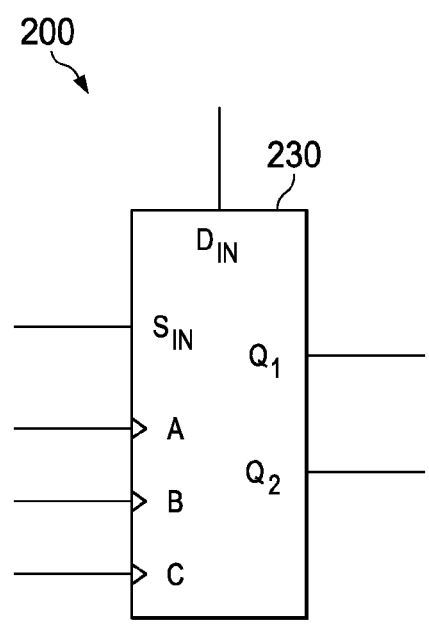

FIG. 2B illustrates a functional abstraction 230 of the scan cell 200. The functional abstraction 230 may also be implemented as an element of a library of standard logic elements. In this representation, the scan cell 200 appears as a single functional block with two data inputs for $S_{IN}$ and $D_{IN}$, three clock inputs A, B and C, and two outputs $Q_1$ and $Q_2$.

Figure 3:
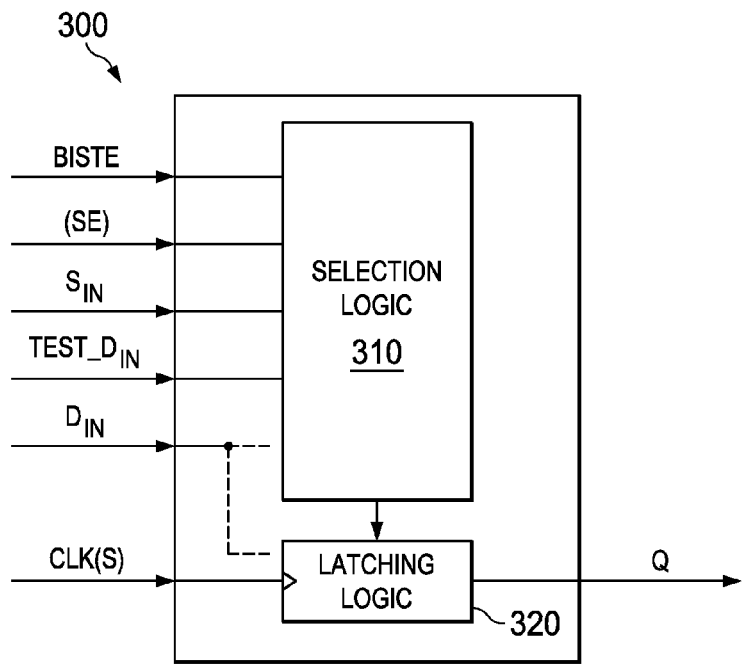
FIG. 3 illustrates a scan cell of the disclosure.

FIG. 3 illustrates a scan cell 300 of the disclosure. The scan cell 300 differs from the scan cells 100, 200 by including a BIST enable (BISTE) input. Some embodiments also include an SE input, the presence of which depends, as discussed further below, on the particular internal configuration of the scan cell 300. The scan cell 300 further differs from the scan cells 100, 200 by including three data inputs, $S_{IN}$, $D_{IN}$ and test_$D_{IN}$.

Selection logic 310 receives the BISTE input, $S_{IN}$, and test_$D_{IN}$ signals, and optionally the SE signal, if present. The latching logic 320 receives one or more clocks, represented as CLK(s). In some embodiments the selection logic 310 receives the $D_{IN}$ signal, while in other embodiments the latching logic receives the $D_{IN}$ signal. A dashed line denotes the optional routing of the $D_{IN}$ signal in FIG. 3. In some embodiments the selection logic 310 determines which of $S_{IN}$, test_$D_{IN}$, and $D_{IN}$ to present at an output Q of the scan cell 300, and in some embodiments the selection logic 310 and the latching logic 320 cooperate to determine which signal to present at the output Q. The determination is based at least on the state of BISTE, and in some embodiments based further on the state of SE and/or the CLK(s). The operation of the scan cell 300 is described further by various embodiments that follow. Advantageously the selection logic 310 is configured such that the data provided by the $D_{IN}$ input are subjected to little or no additional latency relative to a conventional scan cell such as the scan cells 100, 200. This aspect is described in detail below.

Figure 4:
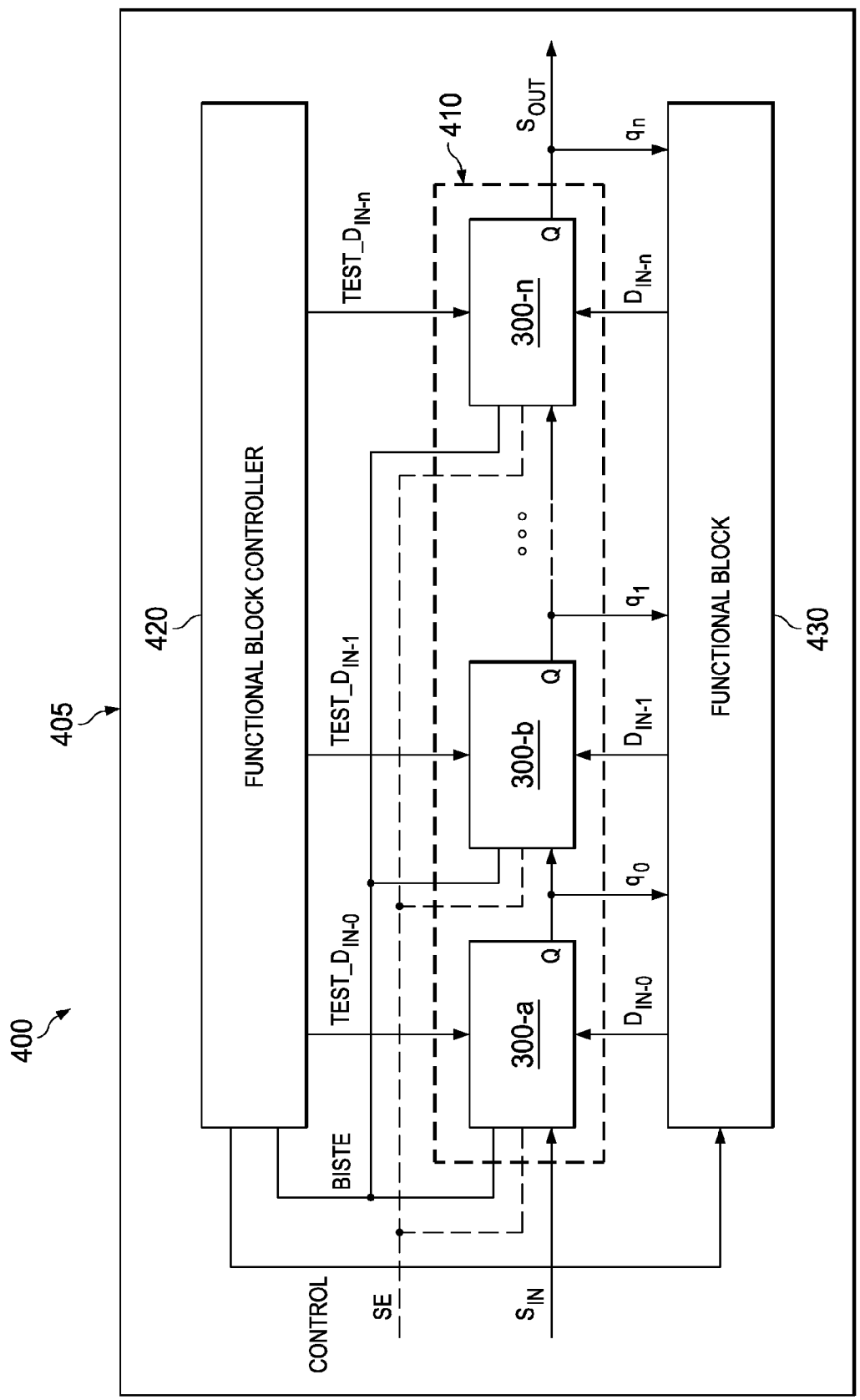
FIG. 4 illustrates an integrated circuit including a functional block test system of the disclosure.

FIG. 4 illustrates an IC 400 of the disclosure. The IC 400 includes a substrate 405 and a scan chain 410 located thereover that includes a number of scan cells 300, designated 300-$a$, 300-$b$ . . . 300-$n$. The operation of the scan chain 410 is described for the case that the scan cells 300 are as described by a scan cell 500 described in FIG. 5. Each scan cell 300 receives the BISTE signal from a functional block controller 420. In embodiments exemplified by the scan cell 500 each scan cell 300 receives the SE signal from a scan controller (not shown). Some embodiments employ a scan cell design exemplified by a scan cell 600 is FIG. 6. In such embodiments the function of the SE signal is replaced by appropriate phasing of the A and B clock signals. Those skilled in the pertinent art are capable of making the necessary modifications.

A scan data bit sequence $S_{IN}$ enters the scan chain 410 via the scan cell 300-$a$. The Q output of each scan cell 300 is received by the selection logic 310 (FIG. 3) of the following scan cell 300, with the exception of the terminal scan cell 300-$n$ which provides an output serial bit sequence via S_out. Each scan cell 300 receives a corresponding test_$D_{IN}$ bit from the functional block controller 420.

Each scan cell 300 additionally receives a corresponding $D_{IN}$ bit from a functional block 430 that is controlled by the functional block controller 420. The functional block 430 may be, e.g. a combinatorial logic block or a memory. During normal operation, the functional block 430 receives control signals (not shown) to store and retrieve data used within the IC 400.

During a test of the functional block 430, e.g. an end-of-line test, the SE signal is asserted and the $S_{IN}$ path provides a serial bit sequence to load the scan chain 410 with a desired bit pattern. The bit pattern may be input in parallel to the functional block 430 via $q_0, q_1, \ldots q_n$. The scan chain 410 may subsequently retrieve in parallel a response pattern from the functional block 430. The response pattern may then be serially shifted out from the scan chain 410 via $S_{OUT}$ for evaluation.

During a self-test, e.g. after installation in an end product, the functional block controller 420 may control the scan chain 410 to load parallel data therein, such as a 16-bit test vector. The functional block controller 420 may then control the functional block 430 to store the test vector output by the Q-outputs of the individual scan cells 300. The functional block controller 420 may further control the functional block 430 to retrieve a response vector therefrom and store the individual bits of the response vector in each corresponding scan cell 300. The response vector may then be serially scanned out of the scan cell for evaluation by the functional block controller 420 or other means.

Figure 5:
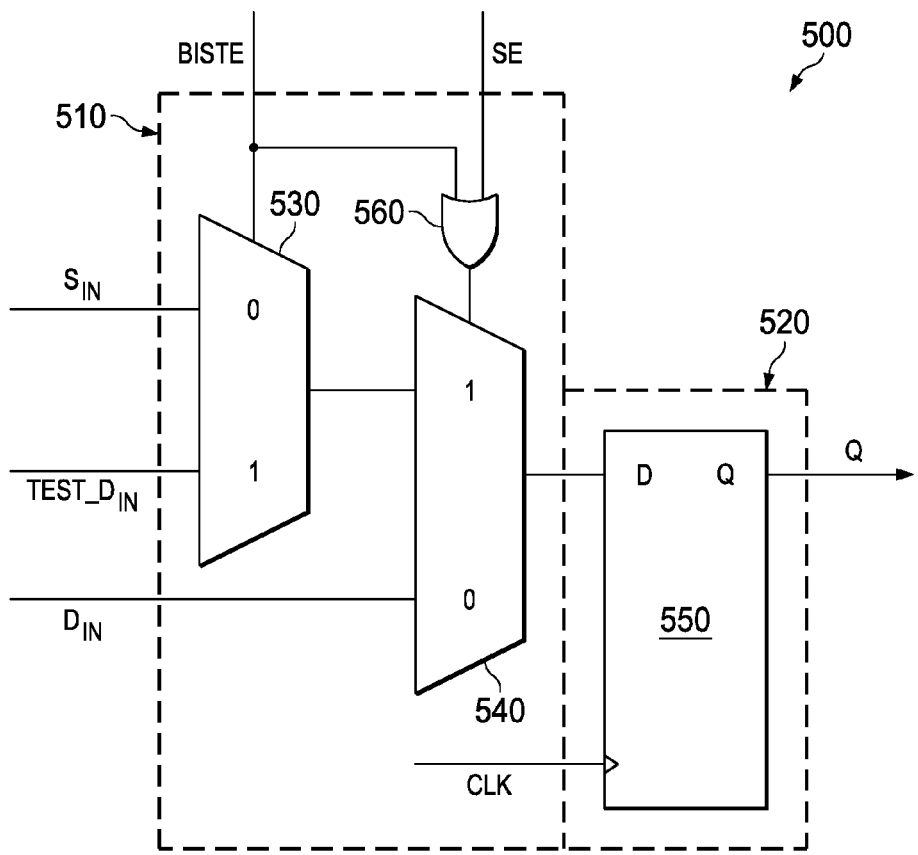
FIG. 5 illustrates an embodiment of the scan cell of FIG. 3 using a D-type flip-flop.

FIG. 5 illustrates an embodiment of the scan cell 500 referred to earlier. The illustrated embodiment is based on a multiplexer cell design and may be employed for the scan cell 300. Those skilled in the pertinent art will appreciate that the function of the illustrated scan cell 500 may be implemented by, e.g. discrete transistors, gates and logic elements other than those illustrated. Any such circuits that provide equivalent operation to that described and/or claimed is within the scope of the disclosure.

In the illustrated embodiment the scan cell 500 includes selection logic 510 and latching logic 520. The selection logic 510 includes a first multiplexer 530 and a second multiplexer 540. The latching logic 520 includes a D flip-flop 550. The first multiplexer 530 selects between $S_{IN}$ and test_$D_{IN}$ under control of the BISTE signal. For example, the first multiplexer 530 may be configured to select $S_{IN}$ when BISTE is unasserted (e.g. FALSE) and test_$D_{IN}$ when BISTE is asserted (e.g. TRUE). The second multiplexer 540 selects between the output of the first multiplexer 530 and the $D_{IN}$ bit under control of SE and BISTE. Thus, the $D_{IN}$ bit is subject to only a single multiplexer delay before the latching logic, while the $S_{IN}$ and test_$D_{IN}$ bits are subjected to two multiplexer delays. An OR gate 560 and the second multiplexer 540 are configured such that when either SE or BISTE are asserted, the output of the first multiplexer 530 ($S_{IN}$ or test_$D_{IN}$) is selected for input to the flip-flop 550. When both SE and BISTE are unasserted the multiplexer 540 selects $D_{IN}$ for input to the flip-flop 550.

Those skilled in the pertinent art will appreciate that the OR gate 560 may be implemented equivalently by a NOR gate or a De Morgan equivalent logic element. For example, the operation of the OR gate 560 and the multiplexer 540 may be provided by a NOR gate in combination with reversing the logical sense at the selector input to the multiplexer 540. In another example the OR gate may be replaced by a NAND gate with negated inputs, in combination with reversing the sense of the SE and BISTE signals and reversing the sense of the selector input to the multiplexer 540. For the purpose of the disclosure and the claims the OR gate encompasses these and any other logic elements that are configured to control the multiplexer 540 to select the output of the multiplexer 530 in the event that one or both of the BISTE and SE signals is asserted.

Advantageously the configuration of the scan cell 500 results in little or no additional latency of the $D_{IN}$ signal relative to the conventional scan cell 100. Other possible configurations, such as for example selecting between the $S_{IN}$ and $D_{IN}$ signals using the first multiplexer 530, would add a multiplexer delay to the $D_{IN}$ signal, increasing the critical path length of the $D_{IN}$ signal and reducing the maximum clock speed of the IC 400. In contrast, the scan cell 500 advantageously shifts the additional multiplexer delay to the $S_{IN}$ and test_$D_{IN}$ signals. While the additional multiplexer delay of these signals may in some cases reduce the maximum possible rate of shifting in serial test data or loading parallel test data to the scan chain 410, in many cases it will be more desirable to accept the delay of these test signals while maintaining the full clock rate of the normal operation of the IC 400.

Figure 6:
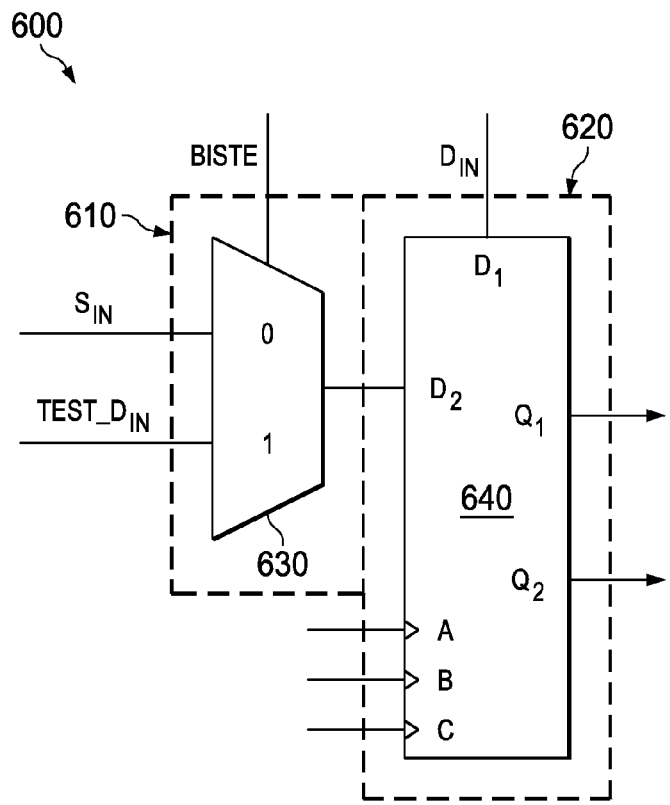
FIG. 6 illustrates an embodiment of the scan cell using a two-phase clocked flip-flop.

FIG. 6 illustrates another embodiment of a scan cell 600 that may be used as the scan cell 300. Those skilled in the pertinent art will appreciate that the function of the illustrated scan cell 600 may be implemented by, e.g. discrete transistors, gates and logic elements other than those illustrated. Any such circuits that provide equivalent operation to that described and/or claimed is within the scope of the disclosure.

In the illustrated embodiment the scan cell 600 includes selection logic 610 and latching logic 620. The selection logic 610 includes a multiplexer 630. The latching logic 620 includes a two-phase clocked flip-flop 640. The flip-flop 640 receives the $D_{IN}$ signal via a $D_1$ input. A $Q_1$ output provides a latched data bit. For instance the data presented at the $D_1$ input is clocked to the $Q_1$ output at an active edge of the A clock. The multiplexer 630 is configured to select between the $S_{IN}$ and test_$D_{IN}$ signals depending on the logical state of BISTE. For example, as illustrated the multiplexer 630 selects $S_{IN}$ when BISTE is unasserted, and selects test_$D_{IN}$ when BISTE is asserted. Thus, the $D_{IN}$ bit is subject to no additional delay by the selection logic, while the $S_{IN}$ and test_$D_{IN}$ bits are subjected to a single multiplexer delay. The flip-flop 640 receives the output of the multiplexer 630 at a $D_2$ input. The output of the multiplexer 630 is clocked to the $Q_1$ output of the flip-flop 640 at an active edge of the B clock. The value of $Q_1$ is clocked to the $Q_2$ output at an active edge of the C clock. Thus, in the present embodiment the C clock does not play a role in determining which of $S_{IN}$, $D_{IN}$ and test_$D_{IN}$ appears at the $Q_1$ and $Q_2$ outputs, but shifts the value of the $Q_1$ output to the $Q_2$ output consistent with the operation of the functional abstraction 230 of FIG. 2.

As described with respect to the scan cell 500, the $D_{IN}$ signal experiences little or no additional latency in the scan cell 600, as compared to the conventional scan cell 200. The $S_{IN}$ and test_$D_{IN}$ signals experience an additional multiplexer delay. But as described previously, it may be preferable that these signals are delayed so that the IC 400 may be clocked during normal operation at a greater clock frequency than possible if the $D_{IN}$ signal were delayed.

The scan cells 500, 600 may be conveniently implemented as library cells in a library of standard logic elements used by an automated design tool. Those skilled in the pertinent art appreciate that automated design tools include various elements of a computational system, including data entry means such as keyboards, data storage elements such as disk drives, semiconductor memory and the like, computational elements such as processors and coprocessors, and networking means. The automated design tool may employ hard and soft macros to implement the various logic elements that are provided by the library.

Figure 7:
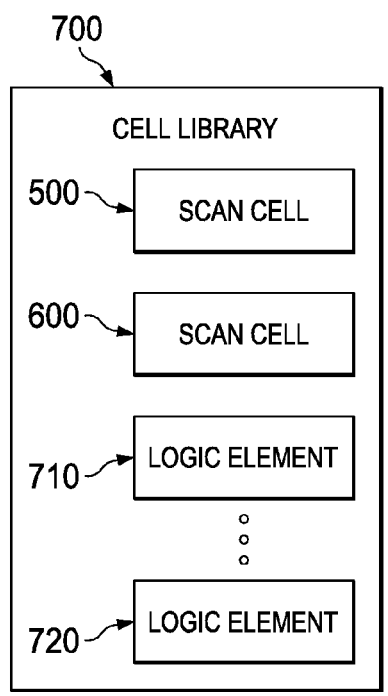
FIG. 7 illustrates a cell library that includes scan cells, e.g. the scan cells of FIGS. 5 and 6.

FIG. 7 illustrates a cell library 700 that may include one or both of the scan cells 500, 600, as well as logic elements 710, 720 representative of other functional blocks that may be implemented in an IC design. An automated design tool may employ the cell library 700 to place any number of instances of the scan cells 500, 600 in the design of an IC such as the IC 400. Stitching routines may then configure the scan cells 500, 600 to form a scan chain such as the scan chain 410. The cell library 700 may exist independent of the automated design tool that implements the logic elements provided by the cell library 700. Thus, the cell library 700 may be physically embodied by a storage medium such as a magnetic or optical disk, or semiconductor memory. The cell library 700 may also be transferred via a communication network from one storage medium to another. For the purposes of the disclosure and the claims any copy of the cell library 700 that is created by transmitting an electronic representation of the cell library 700 from one storage medium to another is regarded as another instance of the cell library 700.

Figure 8:
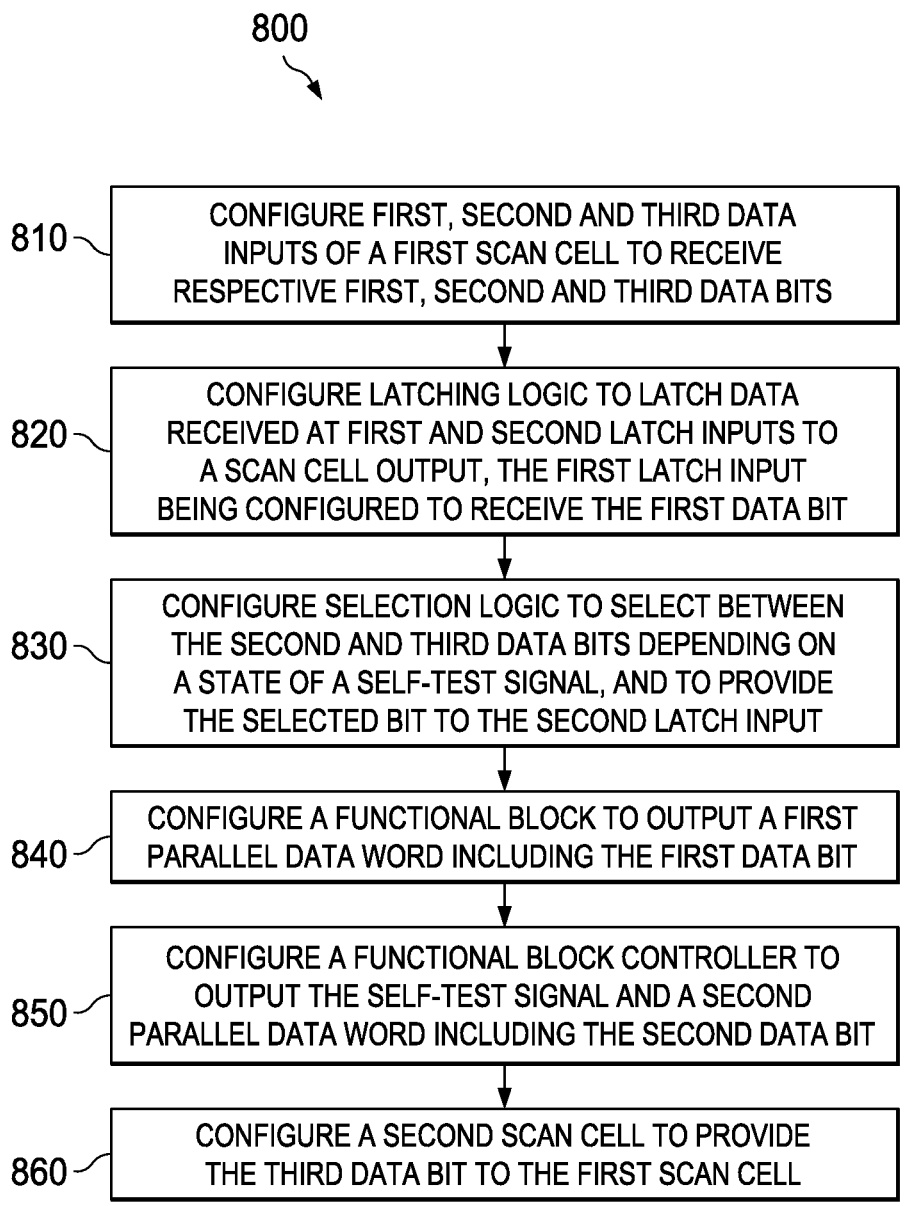
FIG. 8 illustrates a method of forming an integrated circuit.

Turning to FIG. 8, illustrated is a method 800 of the disclosure for forming an integrated circuit. The method 800 is described without limitation with reference to the features described herein, e.g. of FIGS. 3-6. The steps of the method 800 may be performed in an order different from the illustrated order.

In a step 810, first, second and third data inputs of a first scan cell, e.g. the scan cell 300b, are configured to receive respective first, second and third data bits. In a step 820 latching logic is configured to latch data received at first and second latch inputs to a scan cell output, the first latch input being configured to receive the first data bit. In a step 830 selection logic is configured to select between the second and third data bits depending on a state of a self-test signal, and to provide the selected bit to the second latch input.

In an optional step 840 a functional block, e.g. the functional block 430, is configured to output a first parallel data word including the first data bit. In an optional step 850 a functional block controller, e.g. the functional block controller 420, is configured to output the self-test signal and a second parallel data word that includes the second data bit. In an optional step 860, a second scan cell, e.g. the scan cell 300-a, is formed over the substrate and configured to provide the third data bit to the first scan cell.

Those skilled in the art to which this application relates will appreciate that other and further additions, deletions, substitutions and modifications may be made to the described embodiments.

What is claimed is:

1. A scan cell, comprising:
 first, second, and third data inputs configured to receive respective data in, test data in, and serial in data bits;
 a control input configured to receive a control signal;
 latching logic configured to latch data bits received at first and second latch inputs to a scan cell output, said first latch input being configured to receive said data in data bit received from a functional block configured to output a parallel data word including said data in data bit; and
 selection logic configured to select between said test data in and serial in data bits depending on a state of said control signal, and to provide said selected bit to said second latch input, wherein:
 an immediately preceding scan cell of a scan chain provides said serial in data bit; and
 said latching logic comprises a two-phase clocked flip-flop configured to latch said data in data bit to said scan cell output upon operation of a first clock signal, said first clock signal not controlled by said control signal.

2. The scan cell as recited in claim 1, wherein said two-phase clocked flip-flop is further configured to latch said selected bit to said scan cell output upon the operation of a second clock signal.

3. The scan cell as recited in claim 1, wherein said control signal is received from a functional block controller configured to output a parallel test data word that includes said test data in data bit.

4. An integrated circuit, comprising:
 a semiconductor substrate; and
 a scan cell located over said substrate, said scan cell including:
 first, second, and third data inputs configured to receive respective data in, test data in, and serial in data bits;
 a control input configured to receive a control signal;
 latching logic configured to latch data bits received at first and second latch inputs to a scan cell output, said first latch input being configured to receive said data in data bit received from a functional block configured to output a parallel data word including said data in data bit; and
 selection logic configured to select between said test data in and serial in data bits depending on a state of said control signal, and to provide said selected bit to said second latch input, wherein:
 an immediately preceding scan cell of a scan chain provides said serial in data bit; and
 said latching logic comprises a two-phase clocked flip-flop configured to latch said data in data bit to said scan cell output upon operation of a first clock signal, said first clock signal not controlled by said control signal.

5. The integrated circuit as recited in claim 4, wherein said two-phase clocked flip-flop is further configured to latch said selected bit to said scan cell output upon the operation of a second clock signal.

6. The integrated circuit as recited in claim 4, further comprising a functional block controller configured to provide said control signal and a parallel test data word including said test data in data bit.

7. The integrated circuit as recited in claim 6, wherein said functional block includes a memory configured to output said parallel data word.

8. The integrated circuit as recited in claim 6, wherein said functional block is configured to receive said scan cell output.

9. A method of forming an integrated circuit, comprising:
 forming a scan cell, said scan cell including:
 first, second, and third data inputs configured to receive respective data in, test data in, and serial in data bits;
 a control input configured to receive a control signal;
 latching logic configured to latch data bits received at first and second latch inputs to a scan cell output, said first latch input being configured to receive said data in data bit received from a functional block configured to output a parallel data word including said data in data bit; and
 selection logic configured to select between said test data in and serial in data bits depending on a state of said control signal, and to provide said selected bit to said second latch input, wherein:
 an immediately preceding scan cell of a scan chain provides said serial in data bit; and
 said latching logic comprises a two-phase clocked flip-flop configured to latch said data in data bit to said scan cell output upon operation of a first clock signal, said first clock signal not controlled by said control signal.

10. The method as recited in claim 9, wherein said two-phase clocked flip-flop is further configured to latch said selected bit to said scan cell output upon the operation of a second clock signal.

11. The method as recited in claim 9, further comprising forming a functional block controller configured to output a parallel test data word including said test data in data bit.

12. The method as recited in claim 11, wherein said functional block includes a memory configured to output said parallel data word.

13. A library of standard logic elements, comprising:
 a standard logic element corresponding to a scan cell, including:
 first, second, and third data inputs configured to receive respective data in, test data in, and serial in data bits;
 a control input configured to receive a control signal;
 latching logic configured to latch data bits received at first and second latch inputs to a scan cell output, said first latch input being configured to receive said data in data bit received from a functional block configured to output a parallel data word including said data in data bit; and selection logic configured to select between said test data in and serial in data bits depending on a state of said control signal, and to provide said selected bit to said second latch input, wherein:

an immediately preceding scan cell of a scan chain provides said serial in data bit; and said latching logic comprises a two-phase clocked flip-flop configured to latch said data in data bit to said scan cell output upon operation of a first clock signal, said first clock signal not controlled by said control signal.

* * * * *